(12) United States Patent
Blank

(10) Patent No.: US 6,874,895 B2
(45) Date of Patent: Apr. 5, 2005

(54) VEHICLE MIRROR SYSTEM WITH VEHICLE HEADING SENSOR ASSEMBLY

(75) Inventor: Rodney K. Blank, Zeeland, MI (US)

(73) Assignee: Donnelly Corporation, Holland, MI (US)

( * ) Notice: Subject to any disclaimer, the term of this patent is extended or adjusted under 35 U.S.C. 154(b) by 0 days.

(21) Appl. No.: 10/706,338

(22) Filed: Nov. 12, 2003

(65) Prior Publication Data

US 2004/0095646 A1 May 20, 2004

Related U.S. Application Data

(63) Continuation of application No. 10/229,566, filed on Aug. 28, 2002, now Pat. No. 6,648,478.
(60) Provisional application No. 60/315,850, filed on Aug. 29, 2001.

(51) Int. Cl.[7] .............................................. G02B 17/00
(52) U.S. Cl. ...................... 359/604; 359/605; 359/603; 359/871
(58) Field of Search ................................. 359/604–605, 359/601–603, 871–877, 265–267; 307/10.1, 9.1; 250/205, 216, 208.1, 214 R

(56) References Cited

U.S. PATENT DOCUMENTS

| 5,671,996 | A | | 9/1997 | Bos et al. ..................... 362/488 |
| 6,089,721 | A | | 7/2000 | Schierbeek .................. 359/603 |
| 6,163,083 | A | | 12/2000 | Kramer et al. ............. 307/10.1 |
| 6,210,008 | B1 | | 4/2001 | Hoekstra et al. ............ 359/603 |
| 6,217,181 | B1 | | 4/2001 | Lynam et al. ................ 359/879 |
| 6,346,698 | B1 | * | 2/2002 | Turnbull ................. 250/214 R |
| 6,648,478 | B2 | | 11/2003 | Blank | |

* cited by examiner

*Primary Examiner*—Mohammad Sikder
(74) *Attorney, Agent, or Firm*—Van Dyke, Gardner, Linn & Burkhart, LLP

(57) ABSTRACT

A vehicle rearview mirror system includes a rearview mirror assembly having an electro-optic reflective element, a support for attaching the reflective element to a portion of the vehicle and a control. The reflective element is movable with respect to the support. The control is for establishing a reflective level of the reflective element and for determining a heading of the vehicle. The control includes a first circuit assembly and a second circuit assembly interconnected by at least one wire between the first and second circuit assemblies. The first circuit assembly is mounted to be movable with movement of the reflective element. The second circuit assembly is mounted substantially fixed at the support.

25 Claims, 3 Drawing Sheets

VEHICLE MIRROR SYSTEM WITH VEHICLE HEADING SENSOR ASSEMBLY

CROSS-REFERENCE TO RELATED APPLICATION

This application is a continuation of prior U.S. patent application Ser. No. 10/229,566, filed on Aug. 28, 2002, now U.S. Pat. No. 6,648,478, which claims priority from U.S. provisional patent application Ser. No. 60/315,850, filed on Aug. 29, 2001, the disclosures of which are hereby incorporated herein by reference in their entireties.

BACKGROUND OF THE INVENTION

The present invention is directed to a vehicle rearview mirror system and, in particular, to an electro-optic rearview mirror system having vehicle heading sensing capabilities.

Electro-optic mirror systems typically include an electro-optic reflective element, such as an electrochromic reflective element, a liquid crystal element, or the like, and a circuit assembly for establishing a reflectance level of the reflective element. The circuit assembly may, conveniently, be mounted for movement with the reflective element which is moveable to be adjusted to a position convenient to the driver.

Vehicle heading sensing uses a heading sensor, such as a two-axis compass sensor, to sense the earth's magnetic field. The heading sensor functions best if it is mounted stationary with respect to the vehicle body. Therefore, it is common to mount the heading sensor on a circuit board that is separate from the circuit assembly that establishes the reflectance level of the reflective element and electrically connected therewith, such as by an electrical cable.

SUMMARY OF THE INVENTION

The present invention provides a vehicle rearview mirror system in which a first circuit assembly establishing a reflectance level of the reflective element can be mounted for movement accompanying the reflective element and a second circuit assembly/sensor sensing the vehicle heading can be mounted fixed with respect to the vehicle body in a manner which is easier to manufacture and lower in cost than prior such systems.

A vehicle rearview mirror system, according to an aspect of the invention, includes a rearview mirror assembly having an electro-optic reflective element, a support for attaching the reflective element to a portion of the vehicle and a control. The reflective element is movable with respect to the support. The control is for establishing a reflective level of the reflective element and for determining a heading of the vehicle. The control includes a first circuit assembly and a second circuit assembly interconnected by at least one wire between the first and second circuit assemblies. The first circuit assembly is mounted to be movable with movement of the reflective element. The second circuit assembly is mounted substantially fixed at the support.

A vehicle rearview mirror system, according to another aspect of the invention, includes a rearview mirror assembly having a mirror casing for housing an electro-optic reflective element, a support for attaching the mirror casing to a portion of a vehicle and a control for establishing a reflective level of the reflective element and for determining a heading of the vehicle. The mirror casing is pivotally attaching to the support such that the mirror casing that houses the reflective element is moveable with respect to the support. The control includes a first circuit assembly and a second circuit assembly that are electrically interconnected. The first circuit assembly is mounted to be moveable with movement of the mirror casing such that movement of the first circuit assembly is substantially separate from the support. The second circuit assembly is mounted substantially fixed at the support. The second circuit assembly is substantially separate from movement of the mirror casing. The second circuit assembly includes a vehicle-heading sensor.

A vehicle rearview mirror system, according to another aspect of the invention, includes a rearview mirror assembly having an electro-optic reflective element, a support for attaching the reflective element to a portion of a vehicle such that the reflective element is moveable with respect to the support and a control. The control establishes a reflectance level of the reflective element and determines a heading of the vehicle. The control includes a first circuit assembly and a second circuit assembly that are electrically interconnected. The first circuit assembly is mounted to be moveable with movement of the reflective element. The first and second circuit assemblies are built from a common circuit board and interconnected by at least one wire between the first and second circuit assemblies.

According to another aspect of the invention, the first and second circuit assemblies may be built (preferably at a circuit manufacturing assembly line that is located remote from and at a distance from the mirror assembly manufacturing line) from a common circuit board.

According to another aspect of the invention, an opening may be provided in the first circuit assembly that is greater than, or substantially equal to, the size of the second circuit assembly.

According to another aspect of the invention, the support may comprise a ball mount having a ball and the second circuit assembly being mounted to the ball.

These and other objects, advantages and features of this invention will become apparent upon review of the following specification in conjunction with the drawings.

DESCRIPTION OF THE PREFERRED EMBODIMENT

Figure 1:
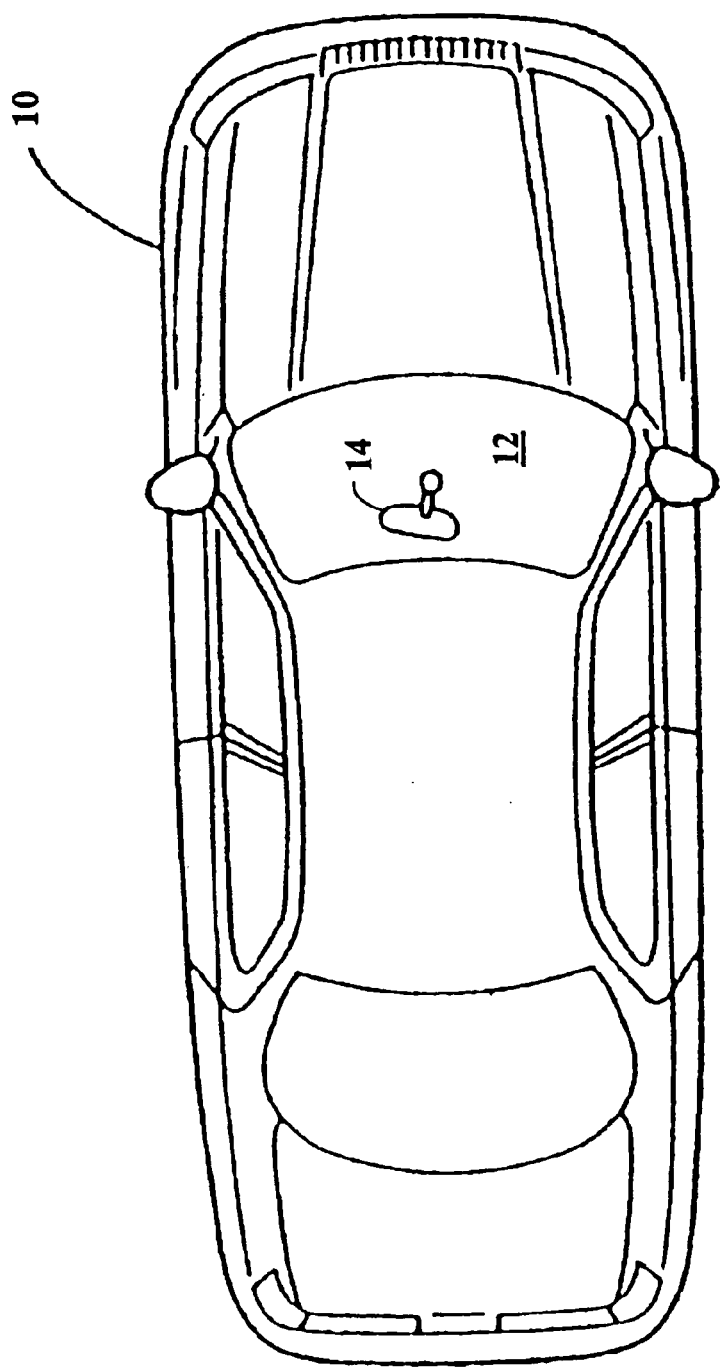
FIG. 1 is a top plan view of a vehicle having a rearview mirror assembly, according to the invention.

Referring now specifically to the drawings, and the illustrative embodiments depicted therein, a vehicle 10 includes a rearview mirror system 12 having at least one rearview mirror assembly 14 (FIG. 1). Rearview mirror assembly 14 has an electro-optic reflective element 16 housed in a mirror casing 17 and a support 20 adapted for attachment to a vehicle windshield or a vehicle header, such as is disclosed U.S. Pat. Nos. 5,487,522; 5,671,996; 5,820,097; 5,615,857; 5,330,149; 5,100,095; 4,930,742; or 4,936,533 or co-pending U.S. patent application Ser. No. 08/781,408, filed Jan. 10, 1997, all commonly assigned to Donnelly Corporation, the disclosures of which are hereby incorporated herein by reference in their entireties, about which the mirror casing is pivotally moveable. The reflective element, and thereby the field of view rearward of the reflective element, is moveable with respect to the support, and adjustable to meet a desired rearward field of view of the driver of the vehicle. Rearview mirror assembly 14 is illustrated as an interior rearview mirror assembly, but the invention may be applied to one or more exterior rearview mirror assemblies as well.

Figure 2:
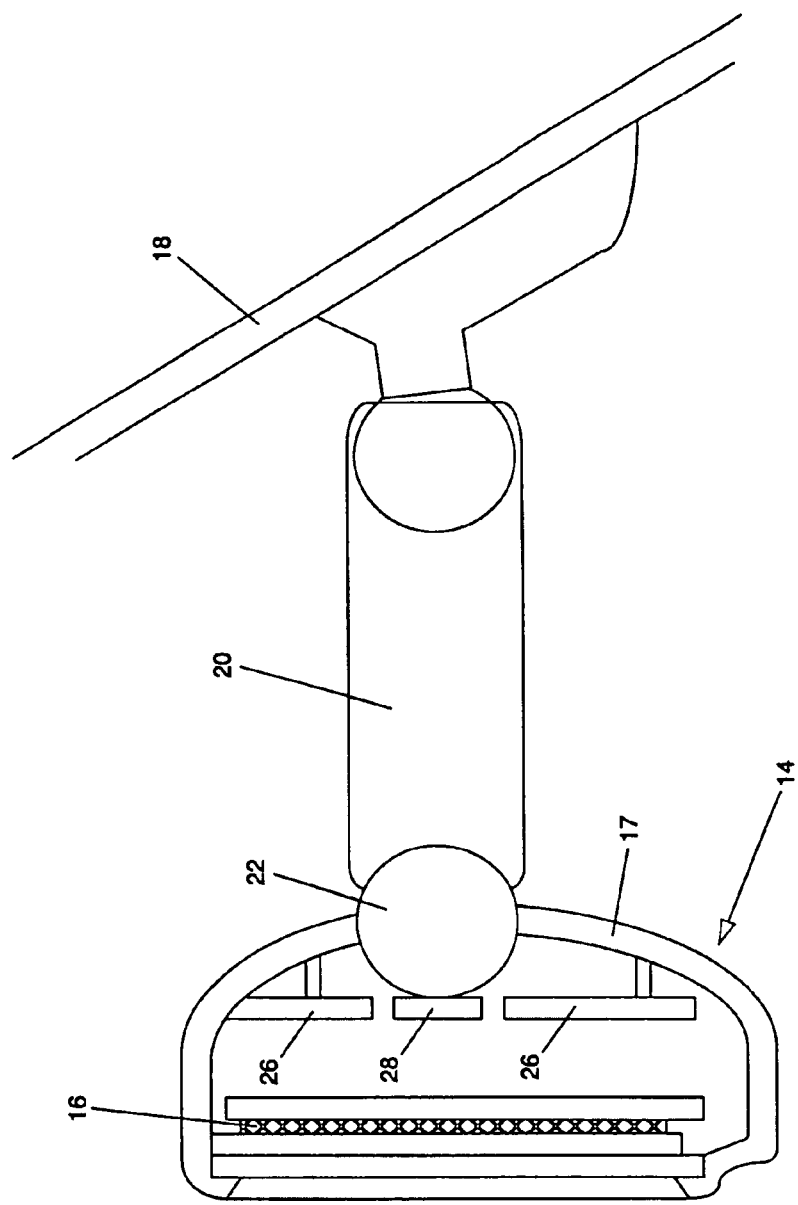
FIG. 2 is a side elevation of a rearview mirror assembly, according to the invention.
Figure 3:
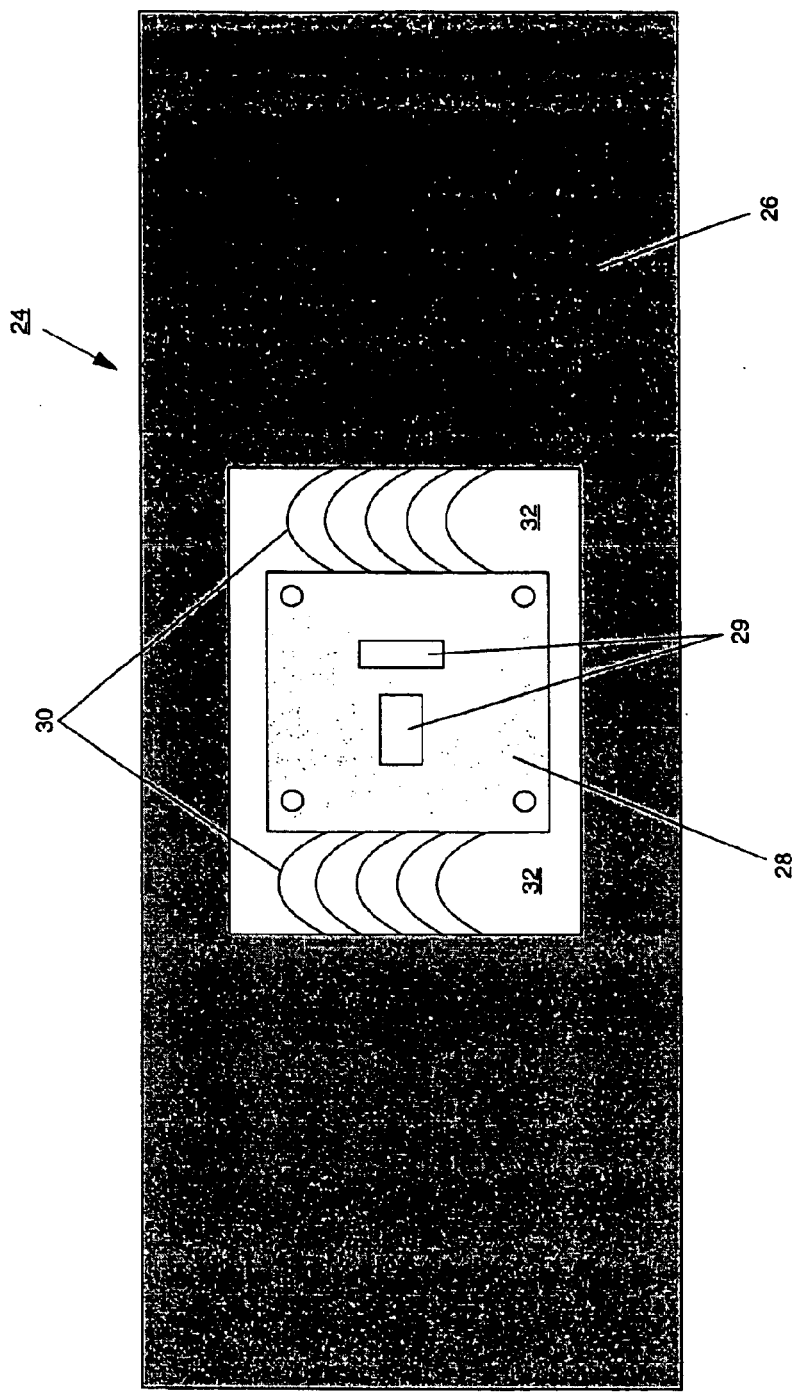
FIG. 3 is an elevation view taken from III—III in FIG. 2

Electro-optic reflective element 16 is moveably mounted to a surface, such as windshield 18, or a portion of the roof adjusted windshield 18, by a support 20 (FIG. 2). Support 20 may be a ball mirror mount, such as a single-ball mount including a ball 22. Rearview mirror assembly 14 further includes a control 24 having a first control assembly 26 and a second control assembly 28 (FIG. 3). First control assembly 26 is moveably mounted for movement with reflective element 16. First control assembly 26 and reflective element 16 may be incorporated in a common housing (not shown) which is also moveable with respect to support 20. First control assembly 16 is comprised of at least one circuit board and a plurality of components on the circuit board electrically interconnected utilizing conductive traces on the circuit board. The circuit of control assembly 26 would include, by way of example, the functions of establishing a reflectance level for electro-optic reflective element 16. Control assembly 26 may also include circuitry for additional functions, such as driving a display (not shown) mounted on or at reflective element 16 and driving one or more LED-based lights positioned within the housing of the reflective element to name a few.

Second control assembly 28 is mechanically mounted at support 20. Second control assembly 28 may be mounted at ball 22, such as at the apex of the ball. Second control assembly 28 includes a circuit having heading sensors 29 for measuring vehicle heading, such as a two-axis compass sensor of the type disclosed in commonly assigned U.S. Pat. Nos. 5,255,442; 5,632,092; 5,644,851; 5,802,727; 6,097,023, the disclosures of which are hereby incorporated herein by reference. First control assembly 26 and second control assembly 28 are interconnected by wiring 30. Flip-chip circuit mounting, as known in the electronics manufacturing art, may be used in circuitry assembly. Wiring 30 comprises one or more electrical interconnections between first and second control assemblies. Wiring 30 may be made by a ribbon cable or a flying lead between first control assembly 26 and second control assembly 28 or may be in the form of one or more wires bonded between the two assemblies utilizing automated bonding techniques. Such automated bonding techniques are known in the art and may include ball-and-stitch bonding across the gap between the circuit assemblies.

In the illustrative embodiment, an opening 32 is defined in first control assembly 26. Opening 32 is configured to be at least as large as second control assembly 28. This allows first control assembly 26 to move with respect to second control assembly 28 as the driver positions the reflective element 16 without interfering with the stationary second control assembly 28.

First and second control assemblies 26, 28 may be manufactured from a common circuit board with second control assembly 28 separated from first control assembly 26 during manufacturing before or after interconnection of the control assembly by wires 30. The second circuit assembly may then be punched out from the first circuit assembly after populating the circuit assemblies with components, commonly soldering the circuit assemblies either before or after interconnecting the circuit assemblies with the wires 30 depending upon the type of interconnection utilized between the circuit assemblies.

First control assembly 26 and second control assembly 28 are in close proximity to each other. This allows relatively short electrical interconnection between the control assemblies.

Second control assembly 28 may additionally include driving circuitry for driving an optical display which may be on or at reflective element 16 or may be mounted elsewhere in the vicinity of rearview mirror assembly 14, such as disclosed in commonly assigned U.S. Pat. Nos. 6,087,953 and 6,222,460 B1, the disclosures of which are hereby incorporated herein by reference.

Thus, it is seen that the present invention provides a technique for manufacturing in an efficient and low-cost manner a complete control assembly for a rearview mirror assembly which is capable of supporting multiple functions associated with the rearview mirror assembly including automatic dimming of the rearview mirror, vehicle heading sensing, as well as a display to read out the heading of the vehicle, as well as other functions. Furthermore, this may be accomplished in a manner which avoids the necessity of a separate housing for the portion of the control assembly which supports the vehicle heading sensor and, therefore, should be mounted on a stationary portion of the vehicle while allowing other portions of the control assembly to be moveable with movement of the reflective element as the driver adjusts the position of the mirror to the liking of the driver. Thus, and in accordance with the present invention, an electronics manufacturer can populate with electronic components a printed circuit board (PCB) for use in, for example, a compass electrochromic interior mirror single-ball assembly. In accordance with the present invention, the electronics manufacturer (that often manufactures such PCBs in a factory located remotely from the factory where interior mirror assemblies are manufactured) preferably populates a single printed circuit board (or a similar circuitry substrate) with the electronic circuitry required both to vary the reflectivity of the electrochromic reflective element used in the interior mirror assembly and to sense/process/display the compass directional heading of the vehicle equipped with the compass EC interior mirror assembly. The compass sensor element used (preferably, a chip-mounted magneto-resistive sensor or a magneto-inductive sensor) and any directly associated circuitry (that constitutes the compass sensing circuitry) are mounted by the electronics manufacturer onto a portion of the PCB (such as a central portion or an edge region portion) that can be later broken away/detached from the rest of the PCB (that is populated with the EC auto dimming circuitry, with compass information processing circuitry, with a display/display driver, and the like) such as by providing a perforated demarcation between the compass sensing portion of the PCB and the rest of the PCB. Circuitry on the compass sensing portion of the PCB connects to circuitry on the rest of the PCB via flexible leads (such as flying leads or wires) that bridge across the demarcation perforated break-out region. The PCB is shipped by the electronics supplier to the interior mirror manufacturer. During assembly of the interior mirror assembly, the PCB is typically attached to the rear of the reflective element used. Just prior to or after this step, the portion of the PCB upon which the compass sensing circuitry is located is broken away by breaking out the demarcation perforations, but this now broken-out or detached PCB portion still remains in circuit connection with the rest of the PCB via the bridging flexible wires (that typically are about 0.75 inches to about 2.5 inches in length). This being a single-ball interior mirror assembly, the mirror housing pivots about a ball pivot that is part of the bracket that is adapted to fixedly attach to a portion of the vehicle interior (such as a windshield portion or a header portion). When the mirror housing (and, consequentially, the reflective element held therein) is adjusted by the driver when he/she repositions the mirror housing to select a desired field of view rearward, the ball of this single-ball joint remains fixed in position. The assembler assembling the interior mirror assembly thus attaches (either by adhesion and/or mechanically) the now broken-away/detached compass sensor circuitry "daughter" portion of the PCB to the apex of this fixed single-ball element (with the flying leads or similar wires used remaining connected to the "mother" PCB that is attached, typically, to the rear of the interior EC reflective element). Thus, when the assembly is installed in the vehicle, and when a driver moves the interior mirror housing, the compass sensor that is now attached to the fixed-in-place ball of the pivot joint between the bracket (that is itself fixedly attached to, for example, the vehicle windshield) does not change in position. The slack in the leads connecting the daughter board on the ball to the mother board, which is fixed to and moves with the reflective element/mirror housing combination, allows electrical/electronic interconnection between the compass sensing element and movable circuitry that moves in tandem with repositioning of the mirror housing/mirror reflective element. Thus, the directional heading remains unchanged and true (such as displayed by a compass direction information display, such as at the interior mirror assembly) when the mirror housing is repositioned because the mirror sensor element (such as a magneto-resistive element) is not changed when the mirror housing position changes (the compass sensor element being fixedly attached to the fixed ball element on the bracket that itself is fixedly attached either to the windshield or to the header).

Also, a prismatic mirror element movable between a day-state and a night-state, as known in the automotive mirror arts, can be used as the reflective element in interior mirror assemblies of the present invention.

Further, any one, or all, of the photo-sensors, such as described above, can consist of a photo-diode element or a photo-transistor element (or a plurality of photo-diode elements and/or photo-transistor elements) established on a substrate (such as a silicon substrate) and with other circuit elements (such as resistors, capacitors, transistors, diodes, and the like, such as might be used in, for example, signal amplification or buffering, or the like) also established on that silicon chip or similar substrate element (and preferably established using semi-conductor manufacturing methods such as, for example, used in CMOS device manufacture), and most preferably sealed and provided into a PCB-mountable integrated circuit package (or, more preferably, in a form suitable for use in flip-chip mounting onto the PCB where the chip is installed and where it is sealed in-situ when mounted on the board). Thus, by using such an integrated photo-diode package/chip or such an integrated photo-transistor package/chip, a board-mountable package can be provided particularly suitable for use in digital electrochromic circuits for electrochromic mirrors, such as are disclosed in U.S. Pat. Nos. 6,056,410 and 6,089,721, which are commonly assigned with the present application to Donnelly Corporation, the disclosures of which are hereby incorporated herein by reference.

Changes and modifications in the specifically described embodiments can be carried out without departing from the principles of the invention which is intended to be limited only by the scope of the appended claims, as interpreted according to the principles of patent law including the doctrine of equivalents.

The embodiments of the invention in which an exclusive property or privilege is claimed are defined as follows:

1. A vehicle rearview mirror system, comprising:
   a rearview mirror assembly comprising an electro-optic reflective element, a support for attaching said reflective element to a portion of a vehicle, said reflective element is moveable with respect to said support;
   a control for establishing a reflectance level of said reflective element and for determining a heading of the vehicle;
   said control comprising a first circuit assembly and a second circuit assembly that are electrically interconnected, wherein said first circuit assembly is mounted to be moveable with movement of said reflective element, wherein said first and second circuit assemblies are built from a common circuit board and interconnected by at least one wire between said first and second circuit assemblies.

2. The mirror system in claim 1 wherein said rearview mirror assembly comprises one of an interior mirror assembly and an exterior mirror assembly.

3. The mirror system in claim 1 wherein said support comprises a ball mount having a ball and wherein said second circuit assembly is mounted at said ball.

4. The mirror system in claim 1 wherein said first and second circuit assemblies are interconnected by ball-and-stitch bonding between said first and second circuit assemblies.

5. The mirror system in claim 1 wherein said first and second circuit assemblies are interconnected by a ribbon cable.

6. The mirror system in claim 1 wherein said heading sensor comprises a two-axis compass sensor.

7. The mirror system in claim 1 wherein said rearview mirror assembly includes a housing for said reflective element and said control.

8. The mirror system in claim 7 wherein said housing is mounted to be moveable with movement of said reflective element.

9. The mirror assembly in claim 1 including an opening in said first circuit assembly that is greater than or substantially equal to a size of said second circuit assembly.

10. The mirror assembly in claim 9 wherein said second circuit assembly is generally juxtaposed with said opening in said first circuit assembly.

11. The mirror assembly in claim 9 wherein said rearview mirror assembly comprises one of an interior mirror assembly and an exterior mirror assembly.

12. The mirror assembly in claim 9 wherein said support comprises a ball mount having a ball and wherein said second circuit assembly is mounted at said ball.

13. The mirror assembly in claim 12 wherein said first and second circuit assemblies are interconnected by ball-and-stitch bonding between said first and second circuit assemblies.

14. The mirror assembly in claim 9 wherein said first and second circuit assemblies are interconnected by a ribbon cable.

15. The mirror assembly in claim 9 wherein said heading sensor comprises a two-axis compass sensor.

16. The mirror assembly in claim 9 wherein said rearview mirror assembly includes a housing for said reflective element and said control.

17. The mirror assembly in claim 16 wherein said heading sensor comprises a two-axis compass sensor.

18. The mirror assembly in claim 1 wherein said support comprises a ball mount having a ball and wherein said second circuit assembly is mounted at said ball.

19. The mirror assembly in claim 18 wherein said ball mount comprises a single ball mount.

20. The mirror assembly in claim 1 wherein said rearview mirror assembly comprises one of an interior mirror assembly and an exterior mirror assembly.

21. The mirror assembly in claim 20 wherein said first and second circuit assemblies are interconnected by ball-and-stitch bonding between said first and second circuit assemblies.

22. The mirror assembly in claim 18 wherein said first and second circuit assemblies are interconnected by a ribbon cable.

23. The mirror assembly in claim 18 wherein said heading sensor comprises a two-axis compass sensor.

24. The mirror assembly in claim 18 wherein said rearview mirror assembly includes a housing for said reflective element and said control.

25. The mirror assembly in claim 24 wherein said housing is mounted to be moveable with movement of said reflective element.

* * * * *